United States Patent
Richter et al.

(10) Patent No.: US 12,078,706 B2
(45) Date of Patent: Sep. 3, 2024

(54) TECHNIQUES FOR DETERMINING A FUNCTIONAL MAGNETIC RESONANCE DATA SET

(71) Applicant: Siemens Healthcare GmbH, Erlangen (DE)

(72) Inventors: Julian Richter, Unterpleichfeld (DE); Manuel Stich, Parkstein (DE)

(73) Assignee: Siemens Healthineers AG, Erlangen (DE)

( * ) Notice: Subject to any disclaimer, the term of this patent is extended or adjusted under 35 U.S.C. 154(b) by 81 days.

(21) Appl. No.: 17/946,387

(22) Filed: Sep. 16, 2022

(65) Prior Publication Data
US 2023/0089051 A1     Mar. 23, 2023

(30) Foreign Application Priority Data

Sep. 17, 2021   (EP) .................................... 21197324

(51) Int. Cl.
*G01V 3/00*      (2006.01)
*G01R 33/48*     (2006.01)
(Continued)

(52) U.S. Cl.
CPC ...... *G01R 33/5611* (2013.01); *G01R 33/4818* (2013.01); *G01R 33/56509* (2013.01)

(58) Field of Classification Search
CPC .............. G01R 33/543; G01R 33/5659; G01R 33/3415; G01R 33/36; A61B 5/055
USPC ........................................................ 324/309
See application file for complete search history.

(56) References Cited

U.S. PATENT DOCUMENTS

2013/0099784 A1* 4/2013 Setsompop .......... G01R 33/543
                                                    324/309
2013/0278254 A1* 10/2013 Reeder ............. G01R 33/56563
                                                    324/322

(Continued)

FOREIGN PATENT DOCUMENTS

JP        2007202903 A  *  8/2007

OTHER PUBLICATIONS

Zahneisen B. et al, "Single Shot Concentric Shells Trajectories for Ultra Fast fMRI", Magnetic Resonance in Medicine 68:2 (2012).

(Continued)

*Primary Examiner* — Walter L Lindsay, Jr.
*Assistant Examiner* — Frederick Wenderoth
(74) *Attorney, Agent, or Firm* — Banner & Witcoff Ltd.

(57) ABSTRACT

Techniques for determining a functional magnetic resonance data set of an imaging region of a brain of a patient are disclosed in which blood oxygenation level dependent functional magnetic resonance imaging is used. The techniques include using a plurality of reception coils, and acquiring magnetic resonance signals using parallel imaging and a magnetic resonance sequence defining a k-space trajectory, wherein undersampling in at least two k-space directions is performed. The techniques further include reconstructing the functional magnetic resonance data set from the magnetic resonance signals and sensitivity information regarding the plurality of reception coils using a reconstruction technique for undersampled magnetic resonance data, wherein the k-space trajectory is chosen to allow controlled aliasing in all three spatial dimensions including the readout direction.

18 Claims, 2 Drawing Sheets

(51) Int. Cl.
*G01R 33/561* (2006.01)
*G01R 33/565* (2006.01)

(56) References Cited

U.S. PATENT DOCUMENTS

| | | | |
|---|---|---|---|
| 2015/0177353 A1 | 6/2015 | Setsompop et al. | |
| 2018/0074148 A1* | 3/2018 | Pfeuffer | G01R 33/561 |
| 2018/0100908 A1* | 4/2018 | Setsompop | G01R 33/4835 |
| 2018/0306884 A1* | 10/2018 | Trzasko | G01R 33/4824 |

OTHER PUBLICATIONS

Poser, Benedikt A. et al: "Pulse Sequences and Parallel Imaging for High Spatiotemporal Resolution MRI at Ultra-High Field"; NeuroImage; vol. 168; Apr. 6, 2017; pp. 101-118; XP055892189; 2017.

Su S. et al., "High Spatial Resolution BOLD fMRI Using Simultaneous Multislice Excitation With Echo-Shifting Gradient Echo at 7 Tesla", Magnetic Resonance Imaging 66:86-92 (2020).

Glover G: et al., "Overview of functional magnetic resonance imaging." Neurosurgery clinics of North America vol. 22,2 (2011): 133-9.

Bilgic, Berkin et al. "Wave-CAIPI for Highly Accelerated 3D Imaging" Magnetic Resonance in Medicine, vol. 73, No. 6, pp. 2152-2162, 2015 // DOI: 10.1002/mrm.25347.

Petrov A.Y. et al., "Improving Temporal Resolution in Fmri Using a 3D Spiral Acquisition and Low Rank Plus Sparse (L+S) Reconstruction", NeuroImage 157 (2017).

Otazo, Ricardo et al., "Low-Rank Plus Sparse Matrix Decomposition for Accelerated Dynamic MRI with Separation of Background and Dynamic Components"; Magnetic Resonance in Medicine; vol. 73, No. 3, pp. 1125-1136, 2015.

* cited by examiner

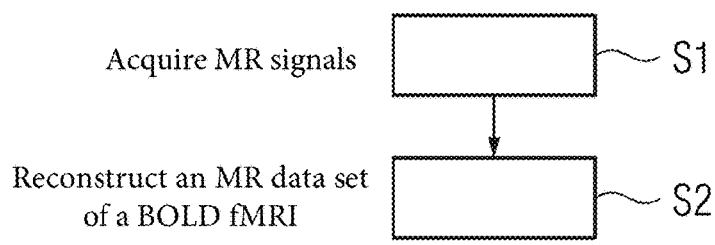
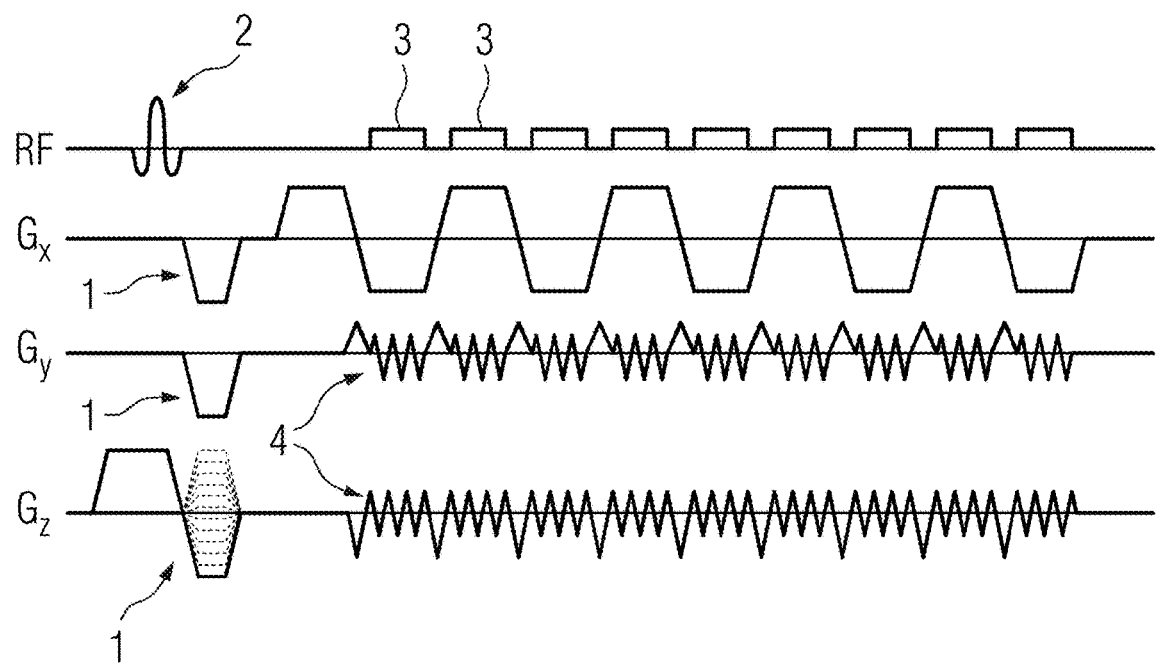

TECHNIQUES FOR DETERMINING A FUNCTIONAL MAGNETIC RESONANCE DATA SET

CROSS-REFERENCE TO RELATED APPLICATIONS

The present application claims priority to and the benefit of Europe patent application no. EP21197324, filed on Sep. 17, 2021, the contents of which are incorporated herein by reference in its entirety.

TECHNICAL FIELD

The disclosure concerns a method for determining a functional magnetic resonance data set of an imaging region of a brain of a patient, wherein blood oxygenation level dependent (BOLD) functional magnetic resonance imaging (fMRI) is used. The disclosure further concerns a magnetic resonance imaging device, a computer program, and an electronically readable storage medium.

BACKGROUND

In blood oxygenation level dependent (BOLD) functional magnetic resonance imaging (fMRI), brain activity is imaged by a magnetic resonance imaging device by continuously acquiring entire magnetic resonance images of the brain during alternating periods of stimulation and rest. Stimulation can, for example, comprise visual stimulation, motoric stimulation, and the like. BOLD imaging relies on regional differences in cerebral blood flow (CBF) to detect regional activities. When a specific region of the brain increases its activity in response to a stimulus, the extraction fraction of oxygen from the local capillaries leads to an initial drop in oxygenated hemoglobin, and an increase in local carbon dioxide deoxygenated hemoglobin. After a few seconds, CBF increases to deliver new oxygenated hemoglobin, washing away deoxygenated hemoglobin. Since the paramagnetic properties of oxygenated hemoglobin and deoxygenated hemoglobin are fundamentally different, they can be distinguished by magnetic resonance imaging. The contrast in BOLD fMRI results from susceptibility induced signal loss in T2*-weighted pulse sequences, which form the basis of BOLD imaging.

However, BOLD contrast changes in the brain are relatively small, and may be difficult to image reliably. In particular, differentiation between true BOLD-contrast changes in the magnetic resonance signal intensity and noise can be a challenging task. On the one hand, higher temporal resolution enables quantitative measurement of the BOLD signal as a function of time and provides insight into the physiological mechanisms leading to the BOLD contrast, see, for example, the article by Benjamin Zahneisen et al., "Single shot concentric shells trajectories for ultra-fast fMRI", Magnetic Resonance in Medicine 68:2 (2012), pages 484-494. On the other hand, high spatial resolution is crucial in mapping the neural activity in small areas of the brain, see, for example, the article by Shi Su et al, "High spatial resolution BOLD fMRI using simultaneous multislice excitation with echo-shifting gradient echo at 7 Tesla", Magnetic Resonance Imaging 66 (2020), pages 86-92. Maintaining both high temporal and spatial resolution is a challenge in BOLD fMRI.

Traditionally, magnetic resonance sequences using 2D-EPI (echo planar imaging) with free induction decay (FID) are used to image the susceptibility induced signal loss in the areas of neural activity. To provide high temporal resolution 2D protocols parallel imaging, in particular GRAPPA, and/or simultaneous multi-slice (SMS) are used. According to an article by Gary H. Glover, "Overview of functional magnetic resonance imaging", Neurosurgery Clinics of North America 22 (2011), 133-139, a compromise between temporal and spatial resolution must be found.

Higher temporal resolution in BOLD fMRI would provide several advantages, for example increased sensitivity in detecting functional activation, the possibility of filtering out physiological noise for improving temporal signal-to-noise ratio (SNR), and freezing out head motion. Generally, faster acquisitions require undersampling of the data, which may result in aliasing artifacts in the spatial domain. Hence, temporal imaging and reconstruction approaches have been proposed regarding parallel imaging, in particular to control aliasing. For example, controlled aliasing in parallel imaging results in higher acceleration (CAIPIRINHA), and improves reconstruction quality for multislice acquisitions by modulating the phase of the simultaneously excited slices. This modification incurs interslice shifts in the phase encoding direction between aliasing image slices, thereby increasing the variation in the coil sensitivity profiles across the slices to improve slice de-aliasing. The application of interslice shifts to three-dimensional imaging forms the basis of 2D-CAIPIRINHA, wherein the encoding strategy in the phase encoding direction and the slice select direction is modified to shift the spatial aliasing pattern to reduce aliasing and better exploit the coil sensitivity variation. Regarding reconstruction techniques, in an article by Ricardo Otazo et al., "Low-rank plus sparse matrix decomposition for accelerated dynamic MRI with separation of background and dynamic components", Magnetic Resonance in Medicine 73 (2015), pages 1125-1136, a new model for undersampled dynamic magnetic resonance data was proposed. This approach assumes that the dynamic MRI data, represented as a space-time matrix M, is a linear superposition of a low-rank matrix L and a sparse matrix S, wherein L represents highly spatially and temporally correlated elements, such as the image background, while S captures dynamic information that is sparse in an appropriate transform domain. Hence, this reconstruction technique is also known as L+S technique.

In an article by Andrii Y. Petrov et al., "Improving temporal resolution in fMRI using a 3D spiral acquisition and low rank plus sparse (L+S) reconstruction", NeuroImage 157 (2017), pages 660-674, it was proposed to acquire a BOLD magnetic resonance data set by using a 3D stack of spirals acquisition with undersampling in the kz-t domain and apply the L+S approach as reconstruction technique. While this method yielded promising results, there is still room for further improvement.

SUMMARY

It is an object of the current disclosure to significantly increase temporal and/or spatial resolution in BOLD fMRI.

This object is achieved by providing a computer-implemented method, a magnetic resonance imaging device, a computer program and an electronically readable storage medium according to the present disclosure, including the claims.

A computer-implemented method for determining a functional magnetic resonance data set of an imaging region of a brain of a patient, wherein blood oxygenation level dependent functional magnetic resonance imaging is used, according to the disclosure comprises the steps of:

using a plurality of reception coils, acquiring magnetic resonance signals using parallel imaging and a magnetic resonance sequence defining a k-space trajectory, wherein undersampling in at least two k-space directions is performed, and reconstructing the functional magnetic resonance data set from the magnetic resonance signals and sensitivity information regarding the plurality of reception coils using a reconstruction technique for undersampled magnetic resonance data, wherein the k-space trajectory is chosen to allow controlled aliasing in all three spatial dimensions including the readout direction.

The disclosure thus proposes to use a 3D k-space trajectory that allows controlled aliasing in all three dimensions, and hence can use the whole coil sensitivity information. That is, e.g. a three-dimensional sensitivity distribution of the reception coils is used as the sensitivity information. In embodiments, the k-space trajectory is chosen as a wave-CAIPI (controlled aliasing in parallel imaging) echo planar imaging (EPI) trajectory by using sinusoidal gradient pulses with a quarter cycle phase shift in the phase encoding direction and the slice select direction combined with interslice shifts and EPI readout. This wave-CAIPI approach is, for example, described in an article by Berkin Bilgic et al., "Wave-CAIPI for Highly Accelerated 3D Imaging", Magnetic Resonance in Medicine 73 (2015), pages 2152-2162.

While the already mentioned 2D-CAIPIRINHA technique employed a staggered ky-kz undersampling pattern, increasing the distance between aliased voxels in the phase encoding-slice select plane and allowing for better utilization of the available variation in the coil sensitivity profiles, the wave-CAIPI technique expands controlled aliasing to the full 3D extent. Two sinusoidal gradients Gy and Gz are played during the readout with a quarter cycle phase shift. Combined with EPI readout, this results in staggered corkscrew trajectories through k-space. In the image domain, the additional phase deposition results in voxel-spreading along the readout direction, which varies linearly as a function of the spatial y and z position. When combined with interslice shifts as known from 2D-CAIPIRINHA, a well distributed aliasing pattern is created across all three spatial dimensions. This allows wave-CAIPI to take full advantage of the 3D coil sensitivity information, and enables up to an order of magnitude increase in acquisition speed with negligible parallel imaging noise amplification and artefact penalty.

In summary, an accelerated setup is proposed for BOLD fMRI using a k-space trajectory, allowing to take coil sensitivity information from all three dimensions into account, e.g. a multi-shot 3D wave-CAIPI EPI k-space trajectory. 3D k-space trajectories inherently yield higher SNR than 2D techniques, which may be traded for an increased slice resolution. The 3D k-space trajectory provides increased potential for acceleration with parallel imaging or compressed sensing, due to the possibility to exploit the full three-dimensional coil sensitivity information, that is, the three-dimensional sensitivity distribution of the reception coils. Using a wave-CAIPI EPI readout instead of standard cartesian EPI readout leads to lower noise enhancement in highly undersampled magnetic resonance data sets. Hence, the proposed technique bears potential to significantly increase temporal and/or spatial resolution in BOLD fMRI, compared with the current standard. In this manner, true BOLD contrast changes in the brain tissue may be discriminated more easily from random fluctuations.

In other words, the combination of the 3D wave-CAIPI k-space trajectory with an EPI-based readout provides the option for significantly increased temporal and/or spatial resolution. Wave-CAIPI has proven to lead to minimal noise enhancement (g-factor penalty) in highly accelerated magnetic resonance imaging. The wave-CAIPI k-space trajectory could be readily implemented in 3D EPI pulse sequences. Higher degrees of undersampling may be used, such that, due to the reduced acquisition time, it is possible to increase the temporal resolution, the spatial resolution, or both at the same time. Generally, to maintain diagnostic image quality, however, sufficient SNR must be retained in the final magnetic resonance data set. The 3D wave-CAIPI technique is an optimal solution for this purpose, since g-factor penalties remain negligible even at high accelerations.

In an embodiment of the current disclosure, a low rank plus sparse (L+S) reconstruction technique is used as the reconstruction technique, wherein the dynamic magnetic resonance data as a space-time matrix is assumed as a linear superposition of a highly spatially and temporarily correlated image background matrix and a sparse dynamic information matrix. The L+S image reconstruction technique has proven very effective in dynamic MRI applications, and has previously been applied to BOLD fMRI, see the cited article by Andrii Y. Petrov. The L+S model takes spatial correlation in 3D images into account, but also temporal correlations in dynamic image series, which facilitates reconstruction of highly undersampled magnetic resonance data sets. In particular in BOLD fMRI, the L+S compressed sensing model is promising, since the BOLD image series typically shows only little variation in signal intensities, such that the image series could be efficiently represented by a low-rank background (L-matrix) and a temporally varying sparse component (S-matrix). If L+S compressed sensing reconstruction techniques are used instead of, for example, GRAPPA and/or SMS, lower noise in undersampled images results, providing the possibility for higher acceleration without compromising image quality.

For example, the undersampling may be performed with a first undersampling factor (acceleration factor) of two to six regarding the phase encoding direction, and a second undersampling factor (acceleration factor) of two to six regarding the slice select direction. This results in a total acceleration factor of the first undersampling factor multiplied with the second undersampling factor. If, for example, the first undersampling factor is chosen as two, and the second undersampling factor is chosen as five, an acceleration factor of ten results. If compared to approaches in the state of the art regarding BOLD imaging, where the maximum acceleration factor is four (GRAPPA R=2*SMS R=2), the current disclosure allows higher acceleration factors, for example nine-fold acceleration or ten-fold acceleration, while keeping the g-factor close to unity. The noise enhancement is minimal.

The disclosure further concerns a magnetic resonance imaging device, comprising a control device configured to perform a method according to the disclosure. All comments and remarks regarding the method according to the disclosure analogously apply to the magnetic resonance imaging device according to the disclosure, such that the same advantages can be achieved.

The control device may comprise at least one processor and at least one storage means. As is known, the control device may further be configured to acquire magnetic resonance signals, comprise a sequence unit configured to control the operation of a gradient coil arrangement, and at least one radio frequency (RF) coil arrangement, which may e.g. comprise a plurality of reception coils. The control device may further comprise a reconstruction unit configured to reconstruct the functional magnetic resonance data set from the magnetic resonance signals acquired using the sequence unit, which is configured to use a k-space trajectory allowing controlled aliasing in all three spatial dimensions including the readout direction, e.g. a 3D wave-CAIPI EPI trajectory.

A computer program according to the disclosure can be directly loaded into a control device of a magnetic resonance imaging device, and comprises a program (e.g. executable instructions or code) means to perform the steps of a method according to the disclosure when the computer program is executed on the control device. The computer program may be stored on an electronically-readable storage medium according to the disclosure, which thus comprises control information comprising a computer program according to the disclosure, such that when the electronically-readable storage medium is used in a control device of a magnetic resonance device, the control device performs the steps of a method according to the disclosure. The electronically readable storage medium may comprise e.g. a non-transitory computer-readable medium, for example a CD-ROM or other suitable storage medium.

BRIEF DESCRIPTION OF THE DRAWINGS

Other objects and features of the present disclosure will become apparent from the following detailed description considered in conjunction with the accompanying drawings. The drawings, however, are intended for the purpose of illustration and do not limit the disclosure. The drawings show:

FIG. 1 illustrates an example flow chart of a method according to one or more embodiments of the disclosure;

FIG. 2 illustrates an example pulse sequence diagram of a magnetic resonance sequence for 3D EPI with wave-CAIPI sampling, according to one or more embodiments of the disclosure;

DETAILED DESCRIPTION OF THE DISCLOSURE

FIG. 1 shows a flow chart of an example method according to the disclosure. In the method, BOLD fMRI is performed in an imaging region of a brain of a patient. In step S1, magnetic resonance signals (raw data) are acquired. The acquisition is performed undersampled along a 3D wave-CAIPI EPI trajectory, such that controlled aliasing in three dimensions is achieved.

FIG. 1 shows a magnetic resonance sequence diagram for the used multi-shot 3D EPI readout with wave-CAIPI sampling. As can be seen, the usual gradient pulses 1 are used after the excitation pulse 2. However, during the readout intervals 3, sinusoidal gradient pulses 4 are used in both the phase encoding direction (Gy) and the slice select direction (Gz). The triangular gradient pulses between the sinusoidal gradient pulses advance the current acquisition line from one phase encoding step to the next, providing the interslice shifts. The shown scheme results in a staggered corkscrew-like trajectory set.

Figure 3:
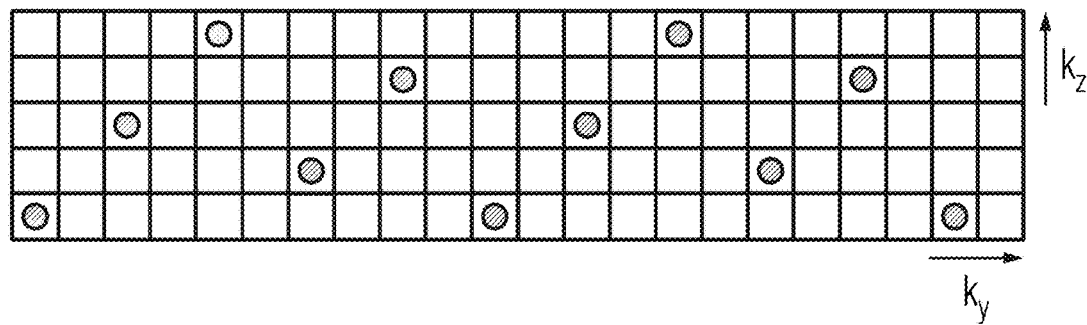
FIG. 3 illustrates an example undersampling pattern, according to one or more embodiments of the disclosure.

As already mentioned, undersampling is applied when acquiring the magnetic resonance signals in step S1. Here, undersampling is applied in the phase encoding direction (Gy) and in the slice select direction (Gz). As can be seen from the exemplary undersampling pattern of FIG. 3, showing the ky-kz-plane, this exemplary undersampling scheme uses an undersampling factor of two in the phase encoding direction and an undersampling factor of five in the slice select direction, resulting in an acceleration factor of 5*2=10. Of course, other undersampling schemes may also be applied.

In a step S2 of FIG. 1, a magnetic resonance data set of the BOLD fMRI is reconstructed using a reconstruction technique. Since aliasing is controlled in all three dimensions, the full three-dimensional coil sensitivity distribution is used as the sensitivity information during reconstruction, increasing the amount of total information used.

In this embodiment, an L+S reconstruction technique is combined with the multi-shot 3D wave-CAIPI EPI k-space trajectory. This combination is particularly advantageous, since temporal and/or spatial resolution may be significantly increased. Since wave-CAIPI has been proven to lead to minimal noise enhancement (g-factor) and the wave-CAIPI k-space trajectory could be readily implemented in 3D EPI resonance sequences, as shown in FIG. 2, high acceleration factors are possible, as explained with respect to FIG. 3. Due to the reduced acquisition time, temporal resolution, spatial resolution, and/or both may be increased. Since the 3D wave-CAIPI technique has a negligible G-factor penalty, high SNR is maintained.

Figure 4:
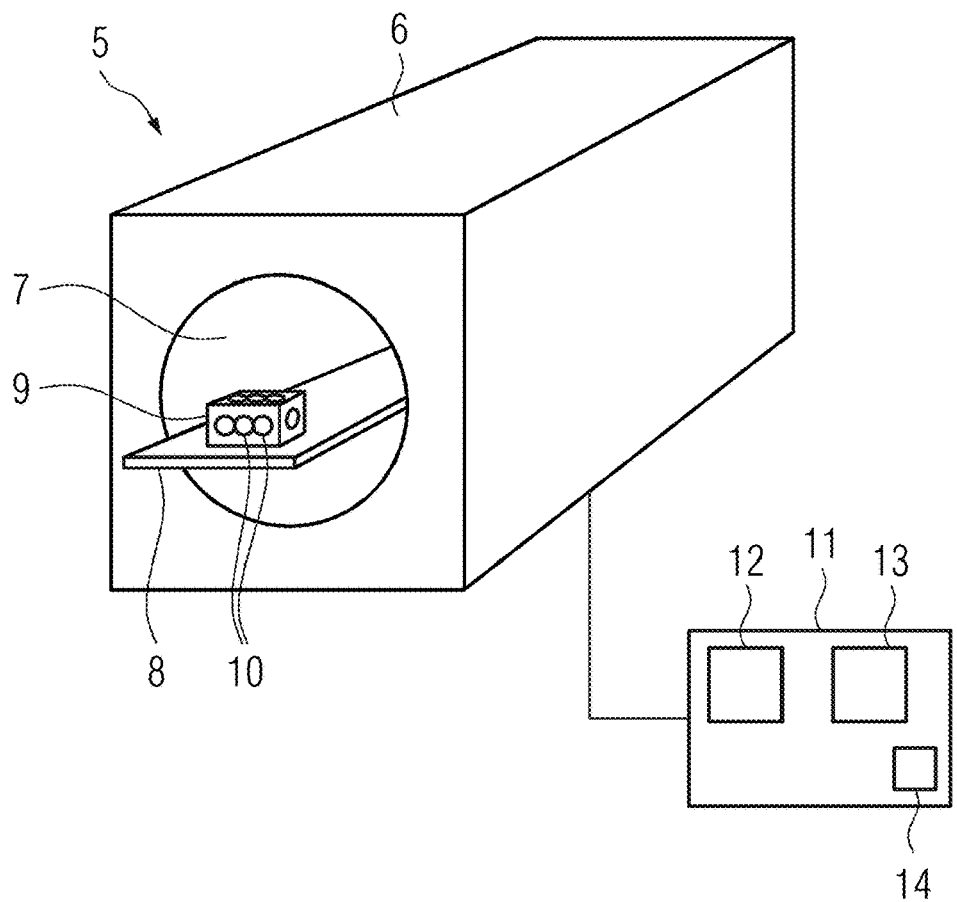
FIG. 4 illustrates an example magnetic resonance imaging device, according to one or more embodiments of the disclosure.

FIG. 4 is a principle drawing of a magnetic resonance imaging device 5 according to the disclosure. The magnetic resonance imaging device 5 comprises a main magnet unit 6 having a cylindrical bore 7 into which a patient may be introduced using a patient table 8. Surrounding the bore 7, a radio frequency coil arrangement and a gradient coil arrangement (not shown) may be provided. In this case, the magnetic resonance signals are acquired using a local head coil 9 comprising a plurality of reception coils 10 whose three-dimensional coil sensitivity distribution is known as sensitivity information to be used in reconstruction step S2, as explained above.

The operation of the magnetic resonance imaging device 5 is controlled by a control device 11, which comprises a sequence unit 12 for controlling the acquisition of magnetic resonance signals, e.g. also according to step S1, and a reconstruction unit 13 for reconstructing magnetic resonance data sets from the acquired magnetic resonance signals, e.g. also according to step S2 as explained above. The control device 11 further comprises a storage means 14, where, for example, the sensitivity information may be stored.

Although the present disclosure has been described in detail with reference to the preferred embodiment, the present disclosure is not limited by the disclosed examples from which the skilled person is able to derive other variations without departing from the scope of the disclosure.

The various components described herein may be referred to as "devices" or "units." Such components may be implemented via any suitable combination of hardware and/or software components as applicable and/or known to achieve the intended respective functionality. This may include mechanical and/or electrical components, processors, processing circuitry, or other suitable hardware components configured to execute instructions or computer programs that are stored on a suitable computer readable medium. Regardless of the particular implementation, such devices and units, as applicable and relevant, may alternatively be referred to herein as "circuitry," "processors," or "processing circuitry."

What is claimed is:

1. A method for determining a functional magnetic resonance (MR) data set of an imaging region of a brain of a patient, the method comprising:
   acquiring, via control device circuitry using a plurality of reception coils as part of blood oxygenation level dependent (BOLD) functional MR imaging, (i) MR signals using parallel imaging, and (ii) a MR sequence defining a k-space trajectory in which undersampling in at least two k-space directions is performed;
   reconstructing, via the control device circuitry using a reconstruction technique for undersampled MR data, the functional MR data set from (i) the MR signals, and (ii) sensitivity information regarding the plurality of reception coils; and
   generating, via the control device circuitry, MR images of the imaging region of the brain of the patient based upon the functional MR data set,
   wherein the k-space trajectory is selected to enable a controlled aliasing in each one of three spatial dimensions, including a readout direction, and
   wherein reconstructing the functional MR data set comprises using a low rank plus sparse reconstruction technique in which dynamic MR data as a space-time matrix is used as a linear superposition of a spatially- and temporally-correlated image background matrix and a sparse dynamic information matrix.

2. A magnetic resonance (MR) imaging device for determining a functional MR data set of an imaging region of a brain of a patient, the MR imaging comprising:
   control device circuitry configured to control operation of the MR imaging device;
   sequence circuitry configured to acquire, using a plurality of reception coils as part of blood oxygenation level dependent (BOLD) functional MR imaging, (i) MR signals using parallel imaging, and (ii) a MR sequence defining a k-space trajectory in which undersampling in at least two k-space directions is performed; and
   reconstruction circuitry configured to reconstruct, using a reconstruction technique for undersampled MR data, the functional MR data set from (i) the MR signals, and (ii) sensitivity information regarding the plurality of reception coils,
   wherein the k-space trajectory is selected to enable a controlled aliasing in each one of three spatial dimensions, including a readout direction,
   wherein the control device circuitry is configured to generate MR images of the imaging region of the brain of the patient based upon the functional MR data set, and
   wherein reconstructing the functional MR data set comprises using a low rank plus sparse reconstruction technique in which dynamic MR data as a space-time matrix is used as a linear superposition of a spatially- and temporally-correlated image background matrix and a sparse dynamic information matrix.

3. A non-transitory computer-readable medium having instructions stored thereon that, when executed by control device circuitry identified with a magnetic resonance (MR) imaging device, cause the MR imaging device to determine a functional MR data set of an imaging region of a brain of a patient:
   acquiring, using a plurality of reception coils as part of blood oxygenation level dependent (BOLD) functional MR imaging, (i) MR signals using parallel imaging, and (ii) a MR sequence defining a k-space trajectory in which undersampling in at least two k-space directions is performed; and
   reconstructing, using a reconstruction technique for undersampled MR data, the functional MR data set from (i) the MR signals, and (ii) sensitivity information regarding the plurality of reception coils,
   wherein the k-space trajectory is selected to enable a controlled aliasing in each one of three spatial dimensions, including a readout direction,
   wherein the control device is configured to generate MR images of the imaging region of the brain of the patient based upon the functional MR data set, and
   wherein reconstructing the functional MR data set comprises using a low rank plus sparse reconstruction technique in which dynamic MR data as a space-time matrix is used as a linear superposition of a spatially- and temporally-correlated image background matrix and a sparse dynamic information matrix.

4. The non-transitory computer-readable medium according to claim 3, wherein the instructions, when executed by the control circuitry, cause the MR imaging device to select the k-space trajectory as a wave-controlled aliasing in parallel imaging (CAIPI) echo planar imaging (EPI) trajectory using sinusoidal gradient pulses having a quarter-cycle phase shift in a phase encoding direction and a slice select direction.

5. The non-transitory computer-readable medium according to claim 4, wherein the instructions, when executed by the control circuitry, cause the MR imaging device to perform the undersampling with a first undersampling factor of 2 to 6 regarding a phase encoding direction.

6. The method according to claim 1, wherein the k-space trajectory is selected as a wave-controlled aliasing in parallel imaging (CAIPI) echo planar imaging (EPI) trajectory using sinusoidal gradient pulses having a quarter-cycle phase shift in a phase encoding direction and a slice select direction.

7. The method according to claim 1, wherein the undersampling is performed with a first undersampling factor of 2 to 6 regarding a phase encoding direction.

8. The method according to claim 1, wherein a three-dimensional sensitivity distribution of the plurality of reception coils is used as the sensitivity information.

9. The MR imaging device according to claim 2, wherein the k-space trajectory is selected as a wave-controlled aliasing in parallel imaging (CAIPI) echo planar imaging (EPI) trajectory using sinusoidal gradient pulses having a quarter-cycle phase shift in a phase encoding direction and a slice select direction.

10. The MR imaging device according to claim 2, wherein the undersampling is performed with a first undersampling factor of 2 to 6 regarding a phase encoding direction.

11. The MR imaging device according to claim 2, wherein a three-dimensional sensitivity distribution of the plurality of reception coils is used as the sensitivity information.

12. The non-transitory computer-readable medium according to claim 3, wherein a three-dimensional sensitivity distribution of the plurality of reception coils is used as the sensitivity information.

13. The non-transitory computer-readable medium according to claim 4, wherein the instructions, when executed by the control circuitry, cause the MR imaging device to select the k-space trajectory as a wave-controlled aliasing in parallel imaging (CAIPI) echo planar imaging (EPI) trajectory combined with interslice shifts and an EPI readout.

14. The non-transitory computer-readable medium according to claim 5, wherein the instructions, when executed by the control circuitry, cause the MR imaging device to perform the undersampling with a second undersampling factor of 2 to 6 regarding a slice select direction.

15. The method according to claim 6, wherein the k-space trajectory is selected as a wave-controlled aliasing in parallel imaging (CAIPI) echo planar imaging (EPI) trajectory combined with interslice shifts and an EPI readout.

16. The method according to claim 7, wherein the undersampling is performed with a second undersampling factor of 2 to 6 regarding a slice select direction.

17. The MR imaging device according to claim 9, wherein the k-space trajectory is selected as a wave-controlled aliasing in parallel imaging (CAIPI) echo planar imaging (EPI) trajectory combined with interslice shifts and an EPI readout.

18. The MR imaging device according to claim 10, wherein the undersampling is performed with a second undersampling factor of 2 to 6 regarding a slice select direction.

\* \* \* \* \*